United States Patent
Yokota et al.

(10) Patent No.: US 7,609,129 B2
(45) Date of Patent: Oct. 27, 2009

(54) SURFACE ACOUSTIC WAVE DEVICE, SURFACE ACOUSTIC WAVE APPARATUS, AND COMMUNICATIONS EQUIPMENT

(75) Inventors: Yuuko Yokota, Soraku-gun (JP); Yoshifumi Yamagata, Soraku-gun (JP); Kiyohiro Iioka, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 152 days.

(21) Appl. No.: 11/190,515

(22) Filed: Jul. 27, 2005

(65) Prior Publication Data
US 2006/0022768 A1 Feb. 2, 2006

(30) Foreign Application Priority Data
Jul. 28, 2004 (JP) ............... 2004-220060

(51) Int. Cl.
H03H 9/72 (2006.01)
H03H 9/05 (2006.01)
H03H 9/64 (2006.01)

(52) U.S. Cl. ..................... 333/133; 333/193
(58) Field of Classification Search ........... 333/193, 333/133
See application file for complete search history.

(56) References Cited

U.S. PATENT DOCUMENTS

| | | | | |
|---|---|---|---|---|
| 5,162,822 A * | 11/1992 | Wakamori | ........... | 333/193 |
| 5,459,368 A * | 10/1995 | Onishi et al. | ........... | 310/313 R |
| 5,721,519 A * | 2/1998 | Onishi et al. | ........... | 333/193 |
| 5,920,142 A * | 7/1999 | Onishi et al. | ........... | 310/313 R |
| 5,998,907 A * | 12/1999 | Taguchi et al. | ........... | 310/313 R |
| 6,310,424 B1 * | 10/2001 | Ogura et al. | ........... | 310/313 R |
| 6,420,815 B1 * | 7/2002 | Tanaka et al. | ........... | 310/313 A |
| 6,933,810 B2 * | 8/2005 | Miura et al. | ........... | 333/193 |
| 6,943,645 B2 * | 9/2005 | Taniguchi | ........... | 333/133 |
| 7,030,716 B2 * | 4/2006 | Tsutsumi et al. | ........... | 333/133 |
| 7,053,731 B2 * | 5/2006 | Iwamoto et al. | ........... | 333/133 |
| 7,196,594 B2 * | 3/2007 | Cheema et al. | ........... | 333/133 |
| 7,208,859 B2 * | 4/2007 | Miura et al. | ........... | 310/313 R |
| 7,227,429 B2 * | 6/2007 | Kawachi et al. | ........... | 333/133 |
| 7,301,421 B2 * | 11/2007 | Yokota et al. | ........... | 333/133 |
| 7,307,369 B2 * | 12/2007 | Yokota et al. | ........... | 310/313 R |
| 2005/0285699 A1 * | 12/2005 | Yokota et al. | ........... | 333/133 |
| 2006/0043822 A1 * | 3/2006 | Yokota et al. | ........... | 310/313 R |

FOREIGN PATENT DOCUMENTS

| | | | | |
|---|---|---|---|---|
| EP | 0 779 708 A2 * | 6/1997 | | |
| JP | 4-313906 | * 11/1992 | ........... | 333/193 |
| JP | 11-205080 | * 7/1999 | | |
| JP | 2001-53579 | * 2/2001 | | |

* cited by examiner

Primary Examiner—Barbara Summons
(74) Attorney, Agent, or Firm—Hogan & Hartson LLP

(57) ABSTRACT

A second substrate 21 composed of a material having a lower dielectric constant than that of a piezoelectric substrate 2 having a transmission-side filter region 12 and a receiving-side filter region 13 formed therein is joined to the other main surface of the piezoelectric substrate 2, and a conductor layer 22 is formed throughout the other main surface of the second substrate 21. The effective dielectric constant of the substrate is reduced, thereby making it possible to reduce a parasitic capacitance formed between an input electrode section 5 in the transmission-side filter region 12 and an output electrode section 6 in the receiving-side filter region 13 and to improve isolation characteristics.

11 Claims, 10 Drawing Sheets

※MNW:MATCHING NETWORK

※MNW: MATCHING NETWORK

※MNW: MATCHING NETWORK

SURFACE ACOUSTIC WAVE DEVICE, SURFACE ACOUSTIC WAVE APPARATUS, AND COMMUNICATIONS EQUIPMENT

BACKGROUND OF THE INVENTION

1. Field of the Invention

The present invention relates to a surface acoustic wave device employed as a high-frequency filter or the like, a surface acoustic wave apparatus, and communications equipment.

2. Description of Related Art

In recent years, surface acoustic wave filters have been employed for various types of communications equipment.

As the frequency and the function of the communications equipment have increased, a request to increase the out-of-band attenuation of the surface acoustic wave filter has progressively increased.

A schematic sectional view of a face-down mounting structure of a conventional surface acoustic wave device is illustrated in FIG. 13.

In FIG. 13, reference numeral 51 denotes a piezoelectric substrate, reference numeral 52 denotes a ground pad, reference numeral 53 denotes an IDT (Inter Digital Transducer) electrode (referred to as an IDT electrode) in a comb shape formed on the piezoelectric substrate 51, reference numeral 54 denotes a conduction pattern formed on a package (mounting substrate) 57, and reference numeral 55 denotes a connecting bump, and reference numeral 59 denotes a conductor layer formed on a reverse surface (a surface opposite to a surface on which the IDT electrode is formed) of the piezoelectric substrate 51.

In the configuration shown in FIG. 13, the ground pad 52 and the IDT electrode 53 are formed of an Al—Cu film, for example, and the conduction pattern 54 and the ground pad 52 are electrically connected to each other by the bump 55 composed of Au, for example. Further, a cover 56 is further subjected to seam welding or the like through a joint layer 58, thereby sealing the package 57 to maintain the internal air-tightness of the surface acoustic wave device accommodating a surface acoustic wave device.

The main cause of degradation of an out-of-band attenuation in the conventional surface acoustic wave apparatus having such a face-down structure is, for example, input-output electromagnetic coupling due to an increase in electrical resistance of an electrode such as the ground pad 52, the IDT electrode 53, the conductor pattern 54 formed on the package 57, etc. in the surface acoustic wave device, a parasitic inductance, or a stray capacitance.

The input-output electromagnetic coupling due to the stray capacitance will be particularly described.

The surface acoustic wave device is a device using a comb-shaped IDT electrode produced on a piezoelectric substrate. Generally, a piezoelectric substance exhibits pyroelectric properties due to a rapid temperature change. When a device having an IDT electrode on a piezoelectric substrate is passed through a step in which there is a rapid temperature change while being manufactured, sparks are generated between electrode sections in the IDT electrode, thereby destroying the device. In order that charges may be stored in the piezoelectric substrate as little as possible, therefore, a conductor layer 59 is generally formed throughout the reverse surface of the piezoelectric substrate.

Although the conductor layer 59 is effective in preventing pyroelectric destruction during the element manufacturing process, however, the inventors found that a capacity coupling occurs between the conductor layer 59 and the input/output electrodes of the IDT electrode 53, which deteriorates the out-of-band attenuation.

In particular, a branching filter (a duplexer) for isolating a signal in a transmission-side frequency band (e.g., a low frequency-side frequency band) and a signal in a receiving-side frequency band (e.g., a high frequency-side frequency band) in the surface acoustic wave apparatus will be described in detail.

The branching filter is referred to as a surface acoustic wave duplexer (hereinafter abbreviated as an SAW-DPX).

In the SAW-DPX, a filter in the transmission-side frequency band (hereinafter referred to as a transmission-side filter) and a filter in the receiving-side frequency band (hereinafter referred to as a receiving-side filter) are formed on the same surface of the same piezoelectric substrate to achieve miniaturization.

When the transmission-side filter and the receiving-side filter are actually formed on the same piezoelectric substrate, however, isolation characteristics between both filters cannot satisfy requirement specifications in a communications terminal.

The isolation characteristics mean the level of a signal leakage from one filter to the other filter. Such a signal leakage must be miniaturized.

Particularly in the branching filter, when a high-power transmission signal amplified on the transmission side leaks from the transmission-side filter to the receiving-side filter to leak to the receiving side, an originally low-power receiving signal cannot be received.

In specifications of the isolation characteristics required for the branching filter, therefore, it is required that a signal leakage is significantly minimized. This requirement is significantly stricter than the requirement of specifications for a Dual-SAW filter employed between stages.

It is considered that one cause of degradation of the isolation characteristics between the filters is leakage of an elastic wave. Particularly in the SAW-DPX, it is considered that an elastic wave excited in an IDT electrode forming the transmission-side filter cannot be sufficiently trapped in the IDT electrode, and the elastic wave that has leaked from the IDT electrode in the transmission-side filter propagates on the surface of the piezoelectric substrate and is received by an IDT electrode forming the receiving-side filter so that the signal leaks from the transmission-side filter to the receiving-side filter, thereby degrading the isolation characteristics (Akinori Miyamoto, Shin-ichi Wakana, and Akio Ito, Fujitsu Laboratories Limited, "Novel optical observation technique for shear horizontal wave in SAW resonators on 42° YX-cut lithium tantalate" 2002 IEEE ULTRASONICS SYMPOSIUM-89).

Specifically, a propagation path of a surface acoustic wave from the IDT electrode in the transmission-side filter and a propagation path of a surface acoustic wave from the IDT electrode in the receiving-side filter are arranged so as to be overlapped with each other on the same straight line. Therefore, it is considered that the surface acoustic wave leaks from the IDT electrode in the transmission-side filter to the IDT electrode in the receiving-side filter, thereby degrading the isolation characteristics.

Therefore, an attempt has been made to improve the isolation characteristics by respectively separating the transmission-side filter and the receiving-side filter that have been formed on the same piezoelectric substrate and forming the filters on separate piezoelectric substrates to cut off the propagation of the leakage of the surface acoustic wave.

In such an attempt, the isolation characteristics are improved. However, the transmission-side filter and the receiving-side filter that have been originally integrally formed are separated and formed on the separate piezoelectric substrates. In a case where the transmission-side filter and the receiving-side filter are mounted on a mounting substrate, therefore, the area of a region serving as a branching filter is larger than that in a case where the transmission-side filter and the receiving-side filter are integrally formed on the same piezoelectric substrate. Therefore, it is impossible to fulfill a miniaturization requirement.

Therefore, it is also considered that the respective IDT electrodes in the transmission-side filter and the receiving-side filter are arranged such that the propagation paths of the surface acoustic wave from both IDT electrodes are parallel to each other, for example, so as not to be overlapped with each other. It should be possible to provide a small-sized SAW-DPX having improved isolation characteristics while forming the transmission-side filter and the receiving-side filter on the same piezoelectric substrate to achieve miniaturization without separating the filters on the separate piezoelectric substrates.

When the inventors of the present invention conducted detailed experiments, however, the isolation characteristics was not improved. This means that the degradation of the isolation characteristics does not result only from the leakage of the surface acoustic wave.

The inventors of the present invention found that the above-mentioned reverse surface conductor layer 59 is effective in preventing pyroelectric destruction during the device manufacturing process but is harmful for the isolation characteristics of the surface acoustic wave device.

If the reverse surface conductor layer and the ground electrode in the mounting substrate are conducted by wiring, therefore, capacitive coupling between the input and output electrode sections in each of the filters can be reduced to some extent. However, this measure does not sufficiently improve the isolation characteristics.

Furthermore, when the IDT electrode formation surface of the piezoelectric substrate and the main surface of the mounting substrate are opposed to each other to perform mounting (flip-chip mounting) with a vibration space ensured therebetween, it is advantageous in miniaturization. However, the reverse surface conductor layer on the reverse surface of the piezoelectric substrate is spaced apart from the main surface of the mounting substrate that can be at a ground potential. Therefore, extra steps are required to ground a portion from the reverse surface conductor layer to the ground electrode on the main surface of the mounting substrate, thereby increasing manufacturing costs are high.

An object of the present invention is to provide a surface acoustic wave device capable of improving the out-of-band attenuation of a filter and being superior in reliability, and communications equipment using the same.

Another object of the present invention is to provide a surface acoustic wave device, particularly, in which a transmission-side filter and a receiving-side filter are formed on the same piezoelectric substrate, being small in size and having superior out-of-band attenuation characteristics, and communications equipment using the same.

SUMMARY OF THE INVENTION

In a surface acoustic wave device according to the present invention, an IDT electrode, an input electrode section, and an output electrode section are formed in a filter region on one main surface of a first substrate composed of a piezoelectric member. A second substrate composed of a material having a lower dielectric constant than that of the first substrate is joined to the other main surface of the first substrate, and a conductor layer is formed on a surface of the second substrate opposite to the surface joined to the first substrate.

According to the surface acoustic wave device in the present invention, the second substrate composed of the material having a lower dielectric constant than that of the first substrate is joined so that the effective dielectric constant of the substrate itself where the IDT electrode is formed can be made lower, as compared with that in a case where a piezoelectric substrate is independently used and a conductor layer is formed throughout the other main surface of the piezoelectric substrate, as in a conventional example.

Consequently, a parasitic capacitance formed between the input electrode section and the output electrode section can be reduced, thereby allowing degradation of out-of-band attenuation characteristics caused by the parasitic capacitance to be restrained. Accordingly, the out-of-band attenuation characteristics can be improved.

If the conductor layer is formed throughout the surface of the second substrate opposite to the surface joined to the first substrate, charges induced by a rapid hysterisis of temperature in manufacturing processes can be efficiently discharged, thereby making it possible to obtain the effect of preventing electrode damage such as pyroelectric destruction caused by the pyroelectric properties of the piezoelectric substrate.

According to the surface acoustic wave device in the present invention, therefore, it is possible to obtain both the effect of satisfactorily preventing pyroelectric destruction and the effect of reducing the effective dielectric constant of a substrate to prevent degradation of out-of-band attenuation characteristics.

If the conductor layer is partially formed on the surface of the second substrate opposite to the surface joined to the first substrate, approximately the same effect of preventing pyroelectric destruction is obtained.

A surface acoustic wave apparatus according to the present invention is also applicable to a branching filter (a duplexer), in which a filter region comprises a transmission-side filter region and a receiving-side filter region, for isolating a signal in a transmission-side frequency band and a signal in a receiving-side frequency band.

Degradation of isolation characteristics in the branching filter is caused by capacitive coupling through a reverse surface conductor layer generally formed throughout the other surface of the piezoelectric substrate between an input electrode section in a transmission-side filter (e.g., a low frequency-side filter) and an output electrode section in a receiving-side filter (e.g., a high frequency-side filter) formed on the main surface of the piezoelectric substrate.

An effect produced in a case where the present invention is applied to a branching filter will be described using the results of simulation and a concept diagram of a circuit used for simulation.

FIG. 9(*a*) is a circuit diagram of communications equipment in a case where there is no parasitic capacitance, FIG. 9(*b*) is a graph showing an example of isolation characteristics, FIG. 9(*c*) is a circuit diagram of communications equipment in a case where there is a parasitic capacitance C caused by a reverse surface conductor, and FIG. 9(*d*) is a graph showing an example of isolation characteristics.

The parasitic capacitance C shown in FIG. 9(*c*) is a parasitic capacitance existing between the input electrode section in the transmission-side filter and the output electrode section in the receiving-side filter and is a very small parasitic capacitance of approximately 50 fF (femto=$10^{-15}$).

As apparent from comparison between FIGS. 9(*b*) and 9(*d*), the signal intensity at 869 MHz to 894 MHz is −30 dB to −40 dB, as shown in FIG. 9(*d*), when such a parasitic capacitance C exists, while being not more than −50 dB, as shown in FIG. 35(*b*), when there is no parasitic capacitance. This proves that the isolation characteristics are significantly improved because there is no parasitic capacitance.

Such a parasitic capacitance of approximately 50 fF corresponds to a capacitance formed when electrodes in the shape of a square, about 180 μm on a side, are opposed to the surface and the reverse surface of the piezoelectric substrate when the dielectric constant is calculated as 42.7 in a case where a lithium tantalate single crystal substrate having a thickness of 250 μm is used as the piezoelectric substrate, for example. Generally, the area of the input-output electrode sections in the surface acoustic wave filter is of this degree. Therefore, it can be said that a value inserted as a parasitic capacitance C by simulation is a value on which reality is appropriately reflected.

It is the parasitic capacitance C between the input electrode section in the transmission-side filter and the output electrode section in the receiving-side filter, herein described, that most greatly affects the isolation characteristics. However, there is also a parasitic capacitance between a connection electrode for connecting the IDT electrodes in one of the filters and the input-output electrode sections in the filter, and there is also a parasitic capacitance between a connection electrode for connecting the IDT electrodes in one of the filters and a connection electrode for connecting the IDT electrodes in the other filter. The parasitic capacitances similarly degrade the isolation characteristics.

According to the present invention, therefore, the second substrate composed of the material having a lower dielectric constant than that of the first substrate serving as the piezoelectric substrate is joined to the other main surface of the first substrate, and the conductor layer is formed on the surface of the second substrate opposite to the surface joined to the first substrate, thereby making it possible to improve the isolation characteristics between the transmission-side filter and the receiving-side filter while integrally forming the transmission-side filter and the receiving-side filter on the same piezoelectric substrate.

According to the surface acoustic wave device in the present invention, when the second substrate is joined to the first substrate through an adhesive layer, the following effect is produced.

In a case where the first substrate serving as the piezoelectric substrate and the second substrate are joined to each other by direct joining, when the first substrate and the second substrate greatly differ in coefficients of thermal expansion, great stress is applied to a brittle piezoelectric substrate when the surface acoustic wave device is subjected to high temperature during manufacturing processes of the device or in mounting the device on a mounting board, so that some problems may arise. For example, the piezoelectric substrate is cracked, and its end is stripped.

Therefore, the first substrate and the second substrate are joined to each other through the adhesive layer so that the stress applied to the piezoelectric substrate can be relaxed by the adhesive layer, thereby making it possible to avoid the problems as in the case of the direct joining. Consequently, there can be stably provided a surface acoustic wave device capable of keeping a state where the second substrate and the first substrate are joined to each other good and having good out-of-band attenuation characteristics.

According to the surface acoustic wave device in the present invention, when the other main surface of the first substrate is a surface rougher than the one main surface of the first substrate, an amount of degradation by propagation of a bulk wave out of degradation factors of out-of-band attenuation characteristics can be also reduced by scattering the bulk wave on the rough surface, thereby allowing the out-of-band attenuation characteristics to be further improved.

The main factor of the degradation of the out-of-band attenuation characteristics is the parasitic capacitance, as so far described. However, the out-of-band attenuation characteristics are also degraded by the fact that an acoustic wave that becomes a bulk wave without being converted into a surface acoustic wave by an IDT electrode in a resonator formed in one filter region propagates in the piezoelectric substrate from the one filter region is reflected on the other main surface of the piezoelectric substrate, and is coupled to an IDT electrode in a resonator formed in the other filter region.

Although the amount of degradation of the out-of-band attenuation characteristics by the propagation of the bulk wave is smaller than an amount of degradation by the parasitic capacitance, it is preferable that the degradation by the bulk wave is also restrained in order to completely satisfy a strict requirement for the out-of-band attenuation characteristics.

On the other hand, the other main surface of the first substrate is a surface rougher than the one main surface of the first substrate. Therefore, the bulk wave is scattered on the rough surface, so that the bulk wave generated from the IDT electrode in the one filter region can be prevented from being sufficiently coupled to the IDT electrode formed in the other filter region, thereby making it possible to further improve the out-of-band attenuation characteristics.

Furthermore, spurious components in the frequency characteristics of the surface acoustic wave device caused by the bulk wave can be restrained, thereby making it possible to obtain desired frequency characteristics.

The degradation of the out-of-band attenuation characteristics by the propagation of the bulk wave can be originally restrained by using the piezoelectric substrate whose surface is greatly roughened, even in a case where the piezoelectric substrate is independently used. The one main surface having the IDT electrode formed thereon, through which the surface acoustic wave propagates, must be a mirror surface. Therefore, the independent piezoelectric substrate whose other main surface is only greatly roughened is greatly warped due to a temperature change and is liable to be damaged during the manufacturing processes of the surface acoustic wave device. On the other hand, the piezoelectric substrate in the surface acoustic wave device is gradually thinned from recent requests to reduce the sizes/heights of electronic components. However, the thinner the piezoelectric substrate becomes, the higher the probability that it is damaged becomes.

On the other hand, according to the surface acoustic wave device in the present invention, the other main surface of the first substrate serving as the piezoelectric substrate is a surface rougher than the one main surface of the first substrate, and the first substrate composed of a piezoelectric member is joined to the second substrate also functioning as a reinforcing substrate. Therefore, the degradation of the out-of-band attenuation characteristics by the propagation of the bulk wave can be efficiently restrained without increasing the danger of damage to the piezoelectric substrate that is made progressively thinner. Further, this is efficient because it can be carried out simultaneously with a measure against the degradation of the out-of-band attenuation characteristics caused by the parasitic capacitance.

According to the surface acoustic wave device in the present invention, when the second substrate is a multilayer substrate, the dielectric constant of the second substrate joined to the first substrate composed of a piezoelectric member can be set by combining multilayer materials in a various manner. Therefore, the degree of freedom of a combination of the dielectric constants of the substrate is increased, and thereby, the dielectric constant of the substrate itself on which the IDT electrode is formed can be reduced. Thus, the parasitic capacitance formed between the input electrode section in the transmission-side filter region and the output electrode section in the receiving-side filter region can be reduced, and the degradation of the out-of-band attenuation characteristics caused by the parasitic capacitance can be restrained, so that the out-of-band attenuation characteristics can be improved.

The second substrate composed of a material having a lower coefficient of thermal expansion than that of the first substrate composed of a piezoelectric member is joined, thereby making it possible to also improve the frequency temperature characteristics of the surface acoustic wave device due to distortion of the substrate by a temperature change, for example.

According to the surface acoustic wave device in the present invention, when the second substrate is composed of a material selected from silicon, glass, sapphire, quartz, crystal, resin, and ceramics, the second substrate having a lower dielectric constant than that of the first substrate composed of a piezoelectric member can be joined to reduce the dielectric constant of the substrate itself. Therefore, the parasitic capacitance formed between the input electrode section in the transmission-side filter region and the output electrode section in the receiving-side filter region can be reduced, and the degradation of the out-of-band attenuation characteristics caused by the parasitic capacitance can be restrained, so that the out-of-band attenuation characteristics can be improved.

When high power is applied to the IDT electrode, the surface acoustic wave device itself generates heat to enter a high temperature state by Joule heat generated by the resistance of the electrode and converting vibration into heat, whereby the stability of the frequency characteristics of the surface acoustic wave apparatus in a high temperature state becomes a problem. When the second substrate composed of a material having higher coefficient of thermal conductivity than that of the first substrate, e.g., sapphire, quartz, ceramics, etc. is joined, however, heat generated in the filter region can be efficiently emitted. Therefore, the rise in the temperature of the substrate itself can be restrained, and degradation of the electrode accelerated by the temperature change can be also restrained.

When the thickness $d2$ of the second substrate is larger than the thickness $d1$ of the first substrate, the following effect is produced. In an attempt to restrain the whole thickness of the surface acoustic wave device within a predetermined value in order to respond to a request to miniaturize the surface acoustic wave device, when only the thickness $d2$ of the second substrate is reduced, the mechanical strength of the whole substrate is lowered because the piezoelectric substrate is brittle. Consequently, it is desirable that the whole thickness is reduced while maintaining a relationship of $d2>d1$. When the coefficient of thermal expansion of the second substrate is lower than the coefficient of thermal expansion of the piezoelectric substrate, the thermal expansion of the second substrate becomes more dominant if the relationship of $d2>d1$ exists, so that the temperature characteristics of the device are improved.

In a surface acoustic wave apparatus according to the present invention, the surface acoustic wave device is mounted on the mounting substrate with the one main surface, on which the filter region is formed, of the first substrate in the surface acoustic wave device opposed thereto.

The piezoelectric substrate in the surface acoustic wave apparatus is desired to be thinner in response to the recent demand of electric components having reduced sizes and heights. As the thickness of the piezoelectric substrate is smaller, the capacitance formed between the electrode on the main surface and the conductor layer on the other surface of the piezoelectric substrate is larger. Thus, the out-of-band attenuation characteristics are further degraded. In this case, the second substrate is joined to the first substrate to form the conductor layer on the reverse surface of the second substrate, whereby the surface acoustic wave apparatus having a small thickness and good out-of-band attenuation characteristics can be obtained.

Furthermore, since the conductive layer is on the other surface of the second substrate in the step of producing the surface acoustic wave apparatus, the pyroelectric destruction of the surface acoustic wave device can be prevented.

When a surface acoustic wave apparatus according to the present invention is applied to a branching filter (a duplexer) comprising a transmission-side filter region and a receiving-side filter region, capacitive coupling between an input electrode in a Tx filter and an output electrode in an Rx filter can be reduced. Therefore, a surface acoustic wave apparatus that does not degrade isolation characteristics can be obtained, although it is a small-sized SAW-DPX. Moreover, a conductor layer is formed on the other main surface of the second substrate, so that pyroelectric destruction can be prevented.

When the surface acoustic wave apparatus is applied to a branching filter (a duplexer) comprising a transmission-side filter region and a receiving-side filter region, and the other main surface of the first substrate is made rougher than the one main surface of the first substrate, the following effect is produced.

A surface acoustic wave excited by an IDT electrode in an SAW-DPX propagates in the piezoelectric substrate after its part is converted into a bulk wave, and is reflected on a reverse surface of the piezoelectric substrate to reach a reverse surface of the piezoelectric substrate again. When a bulk wave generated in a Tx filter by a high-power transmission signal amplified on the transmission side leaks to the receiving side of an Rx filter, therefore, an originally low-power receiving signal cannot be received. Thus, the isolation characteristics of the surface acoustic wave apparatus may be degraded due to the bulk wave.

In the present invention, therefore, the other main surface of the first substrate is made rough to attenuate the bulk wave, thereby making it possible to improve the isolation characteristics of the surface acoustic wave apparatus.

Communications equipment according to the present invention comprises at least one of a receiving circuit and a transmission circuit having the above-mentioned surface acoustic wave apparatus.

According to the communications equipment in the present invention, the above-mentioned surface acoustic wave apparatus according to the present invention is used for the communications equipment, so that a strict out-of-band attenuation that has been conventionally required can be satisfied. Further, the surface acoustic wave apparatus is small in size, although it has good out-of-band attenuation characteristics. Therefore, the mounting areas of other components can be increased, so that options for the components are broadened, thereby making it possible to realize high-functional communications equipment.

Communications equipment according to the present invention uses the above-mentioned surface acoustic wave apparatus as a branching filter.

The above-mentioned surface acoustic wave apparatus according to the present invention is used as a branching filter, so that strict isolation characteristics that are required for the branching filter can be satisfied. Further, the surface acoustic wave apparatus is small in size, although it is a branching filter having good isolation characteristics. Therefore, the mounting areas of other components can be increased, so that options for the components are broadened, thereby making it possible to realize high-functional communications equipment.

The foregoing and other objects, features, aspects and advantages of the present invention will become more apparent from the following detailed description of proffered embodiments of the present invention with reference to the accompanying drawings.

DETAILED DESCRIPTION OF PREFERRED EMBODIMENTS

Figure 1:
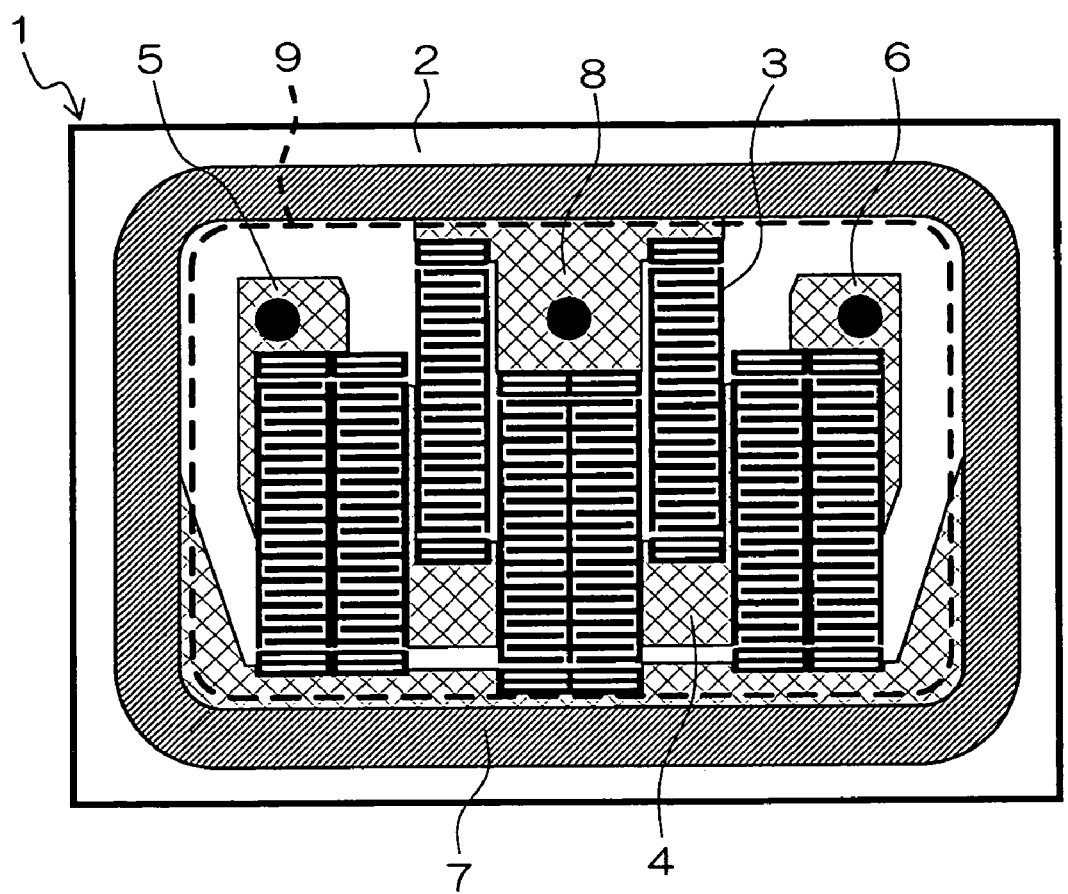
FIG. 1 is a plan view showing a main surface of a piezoelectric substrate having a surface acoustic wave device according to the present invention formed therein.

FIG. 1 is a plan view showing a main surface of a first substrate composed of a piezoelectric member (hereinafter referred to as a "piezoelectric substrate") having a surface acoustic wave device, serving as a constituent element of a surface acoustic wave apparatus according to the present invention, formed therein.

As shown in FIG. 1, a filter region 9 is formed on an IDT electrode formation surface (hereinafter referred to as one main surface) of a piezoelectric substrate 2. A plurality of IDT electrodes 3 composing a ladder-type filter, a connection electrode 4 for connecting the IDT electrodes 3, and an input electrode section 5 and an output electrode section 6 that are electrically connected to the IDT electrodes 3 so as to connect the surface acoustic wave device 1 and a mounting substrate (not shown) are formed in the filter region 9.

Reference numeral 7 denotes an annular electrode in a square frame shape formed so as to enclose the IDT electrodes 3, the connection electrode 4, the input electrode section 5, the output electrode section 6, and a ground electrode 8 (hereinafter referred to as IDT electrodes and others). Reference numeral 8 denotes a ground electrode. The ground electrode 8 is connected to the annular electrode 7.

The annular electrode 7 is connected to an annular conductor on the side of the mounting substrate (hereinafter referred to as a mounting substrate-side annular conductor) using a solder or the like, to function as a ground electrode in a surface acoustic wave filter as well as to have the function of sealing a space between the piezoelectric substrate 2 and the mounting substrate.

In the surface acoustic wave device 1, a second substrate composed of a material having a lower dielectric constant than that of a piezoelectric material is joined to a surface opposite to the one main surface (referred to as the other main surface) of the piezoelectric substrate 2. A conductor layer is formed on a surface of the second substrate 2 opposite to the surface jointed to the piezoelectric substrate 2.

This makes it possible to reduce capacitive coupling occurring between the input electrode section 5 and the output electrode section 6 in the filter region 9 through a parasitic capacitance generated between the electrode sections and the conductor layer, thereby allowing the out-of-band attenuation characteristics of the surface acoustic wave device 1 to be improved.

Although the annular electrode 7 is utilized as the ground electrode in the surface acoustic wave device 1 in this example, the annular electrode 7 may not be used as the ground electrode. Alternatively, the ground electrode 8 in the surface acoustic wave device 1 may be directly connected to a ground electrode in the mounting substrate.

The above-mentioned surface acoustic wave device is mounted on the mounting substrate with the one main surface of the piezoelectric substrate 2 opposed to an upper surface of the mounting substrate, thereby constituting a surface acoustic wave apparatus.

Figure 2:
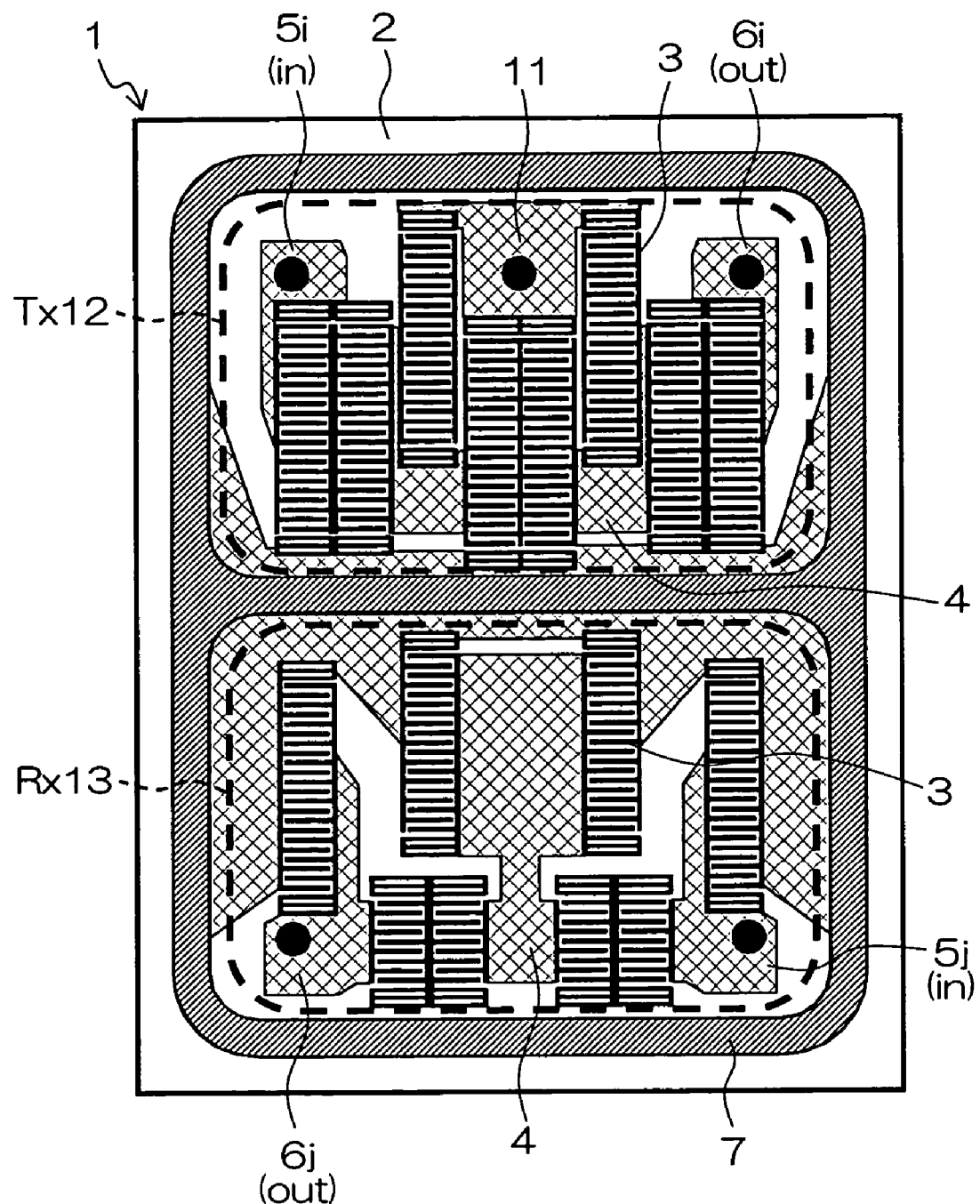
FIG. 2 is a plan view showing a main surface of a surface acoustic wave device having a transmission-side filter and a receiving-side filter formed therein in the present invention.

FIG. 2 is a plan view showing one main surface of another surface acoustic wave device 1 manufactured according to the present invention.

The surface acoustic wave device is an example in which two ladder-type surface acoustic wave devices are used, to constitute a duplexer. Two filter regions are formed so as to respectively compose a transmission-side filter and a receiving-side filter.

As shown in FIG. 2, a transmission-side filter region 12 and a receiving-side filter region 13 are formed on a piezoelectric substrate 2. In the transmission-side filter region 12, a plurality of IDT electrodes 3 and a connection electrode 4 for connecting the IDT electrodes 3, and an input electrode section 5i and an output electrode section 6i that are electrically connected to the IDT electrodes 3 so as to connect a surface acoustic wave device 1 and a mounting substrate (not shown) are formed.

Similarly, in the receiving-side filter region 13, a plurality of IDT electrodes 3 and a connection electrode 4 for connecting the IDT electrodes 3, and an input electrode section 5j and an output electrode section 6j that are electrically connected to the IDT electrodes 3 so as to connect the surface acoustic wave device 1 and the mounting substrate are formed.

An annular electrode 7 is formed so as to individually enclose the transmission-side filter region 12 and the receiving-side filter region 13. The annular electrode 7 is connected to a mounting substrate-side annular conductor formed so as to correspond thereto an upper surface of the mounting substrate using a solder or the like.

In this example, the annular electrode 7 is integrally formed so as to individually enclose the transmission-side filter region 12 and the receiving-side filter region 13, to function as a ground electrode in a receiving-side filter composed of the receiving-side filter region 13 as well as to have the function of separately sealing the transmission-side filter region 12 and the receiving-side filter region 13 between the piezoelectric substrate 2 and the mounting substrate.

Also, in the surface acoustic wave device 1, a second substrate composed of a material having a lower dielectric constant than that of a piezoelectric material is joined to the other main surface of the piezoelectric substrate 2. A conductor layer is formed on a surface of the second substrate opposite to a surface jointed to the piezoelectric substrate 2.

This makes it possible to reduce capacitive coupling between the input electrode section 5i in the transmission-side filter region 12 and the output electrode section 6j in the receiving-side filter region 13 through a parasitic capacitance generated between the electrode sections and the conductor layer, thereby allowing the out-of-band attenuation characteristics of the surface acoustic wave device 1 to be improved.

Figure 3:
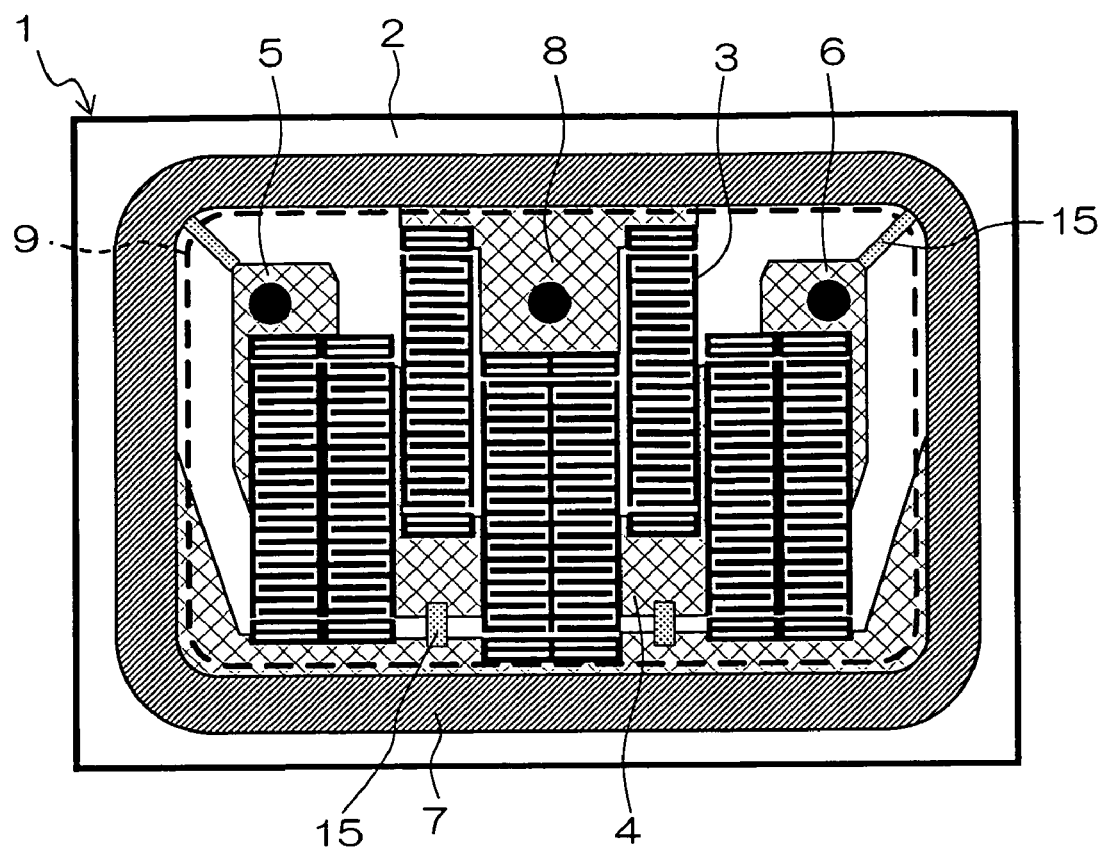
FIG. 3 is a plan view showing a main surface of a piezoelectric substrate in another surface acoustic wave device.

FIG. 3 is a plan view showing one main surface of a piezoelectric substrate 2 in still another surface acoustic wave device 1.

In this example, on the side of the one main surface of the piezoelectric substrate 2, IDT electrodes 3 and an annular electrode 7 are connected to each other through a resistor 15 such that the IDT electrodes 3 are rendered non-conductive to the annular electrode 7 in a high-frequency manner, while being rendered conductive thereto in a DC manner. The annular electrode 7 is at a ground potential by being connected to a mounting substrate-side annular conductor.

Figure 4:
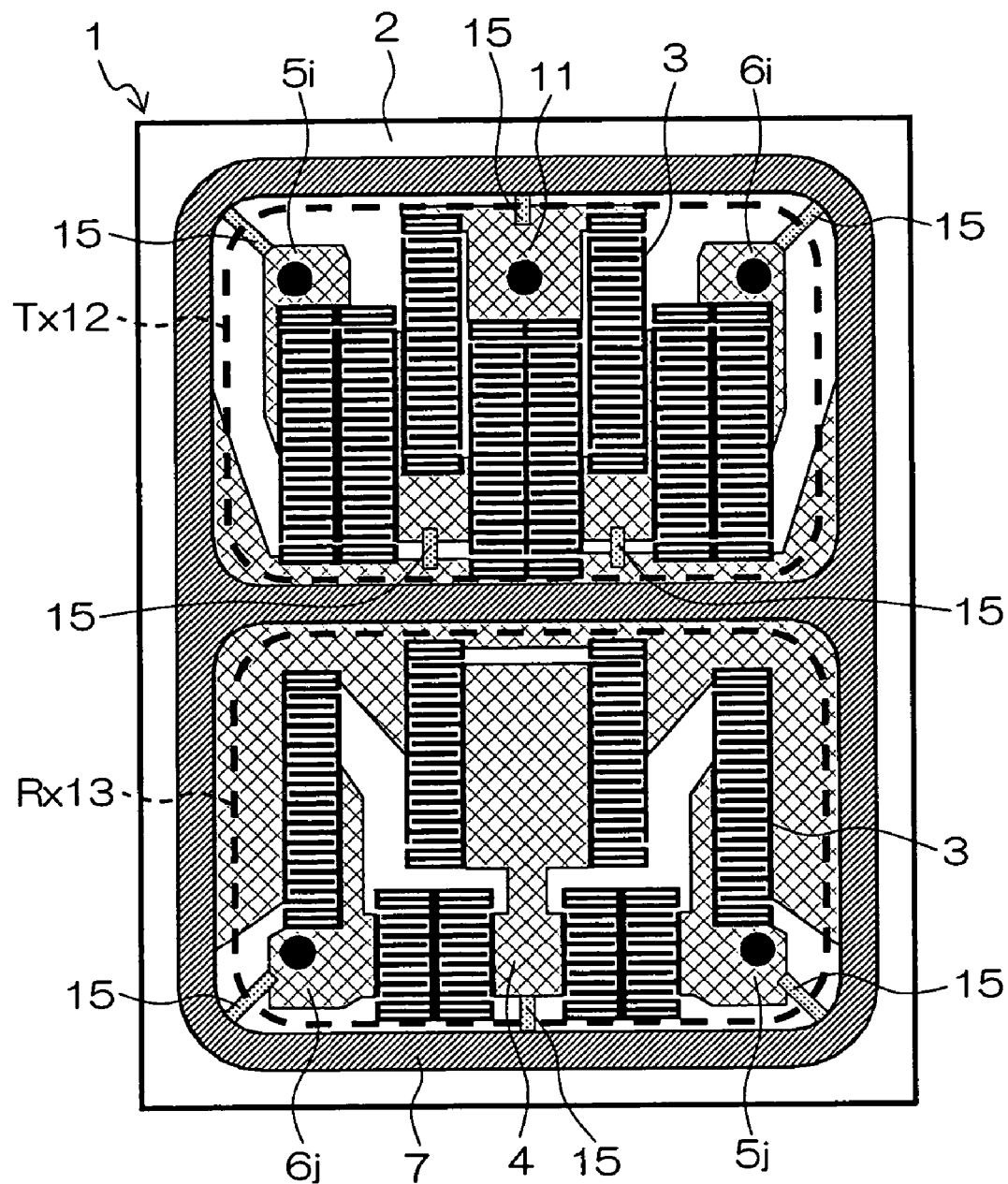
FIG. 4 is a plan view showing a main surface of a piezoelectric substrate in still another surface acoustic wave device.

FIG. 4 is a plan view showing one main surface of a piezoelectric substrate 2 in a surface acoustic wave device 1 having two filter regions formed therein.

Also, in this example, IDT electrodes 3 and an annular electrode 7 are connected to each other through a resistor 15 in each of the two filter regions on the side of the main surface of the piezoelectric substrate 2. Further, the annular electrode 7 is at a ground potential by being connected to a mounting substrate-side annular conductor.

Thus, the IDT electrodes 3 are electrically connected to the annular electrode 7 through the resistor 15. The annular electrode 7 is at a ground potential. This allows charges to be emitted to a ground electrode in a mounting substrate from the main surface of the piezoelectric substrate 2, thereby making it possible to effectively prevent pyroelectric destruction of the surface acoustic wave device 1.

The resistor 15 has a sufficiently high resistance in a frequency band in which a filter is used, to select a resistance value at which it almost looks like an insulator. High-resistance semiconductors such as silicon and a titanium oxide are suitably used as materials for the resistor 15. The resistance value of the material can be controlled to an appropriate value by adding an element such as boron in small amounts or adjusting the composition ratio thereof.

Figure 5:
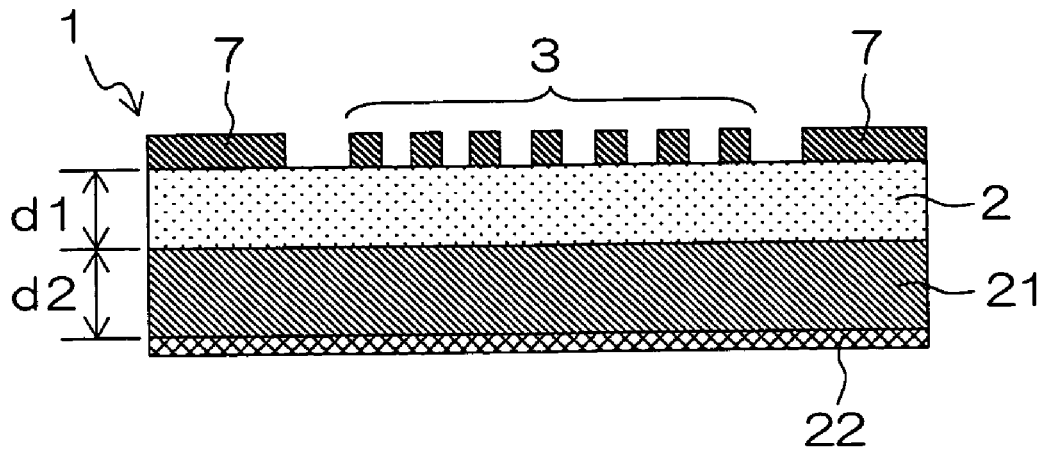
FIG. 5 is a cross-sectional view of a surface acoustic wave device according to the present invention.

FIG. 5 is a cross-sectional view of a surface acoustic wave device according to the present invention.

Figure 6:
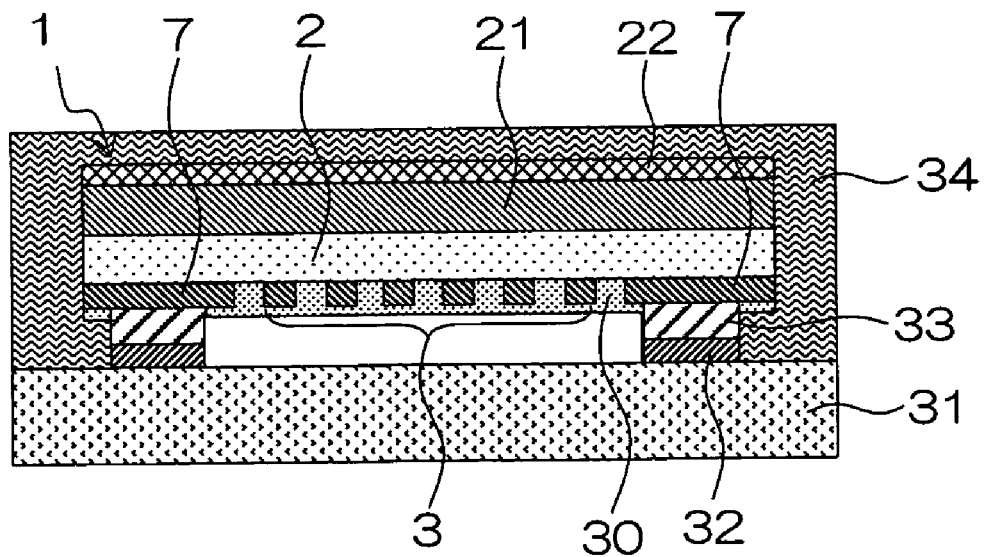
FIG. 6 is a cross-sectional view of a surface acoustic wave apparatus according to the present invention on which the surface acoustic wave device according to the present invention is mounted.

FIG. 6 is a cross-sectional view of a surface acoustic wave apparatus in which the surface acoustic wave device shown in FIG. 5 is mounted on a mounting substrate.

As shown in FIG. 5, an IDT electrode 3 is formed on one main surface of a piezoelectric substrate 2, one main surface of a second substrate 21 composed of a material having a lower dielectric constant than that of the piezoelectric substrate 2 is joined to the other main surface of the piezoelectric substrate 2, and a conductor layer 22 is formed throughout the other main surface of the second substrate 21.

The cross-sectional shapes of the IDT electrode 3 and others shown in FIG. 5 are drawn in a simplified manner. Actually, the IDT electrode 3 and others are IDT electrodes and others as shown in FIGS. 1 to 4.

Here, usable as the piezoelectric substrate 2 are a lithium tantalate single crystal, a lithium niobate single crystal, a lithium tetraborate single crystal, etc.

In a case where lithium tantalate having a dielectric constant of 42.7, for example, is used as the piezoelectric substrate 2, usable as the second substrate 21 having a lower dielectric constant than that of the piezoelectric substrate 2 may be one selected from substrates composed of silicon (a dielectric constant of 3.4), sapphire (a dielectric constant of 9.4), quartz (a dielectric constant of 3.8), crystal (a dielectric constant of 3.8), glass (a dielectric constant of about 3.8), ceramic substrate like alumina (a dielectric constant of about 8.5), etc., and resin substrates composed of polyimide, a liquid crystal polymer (dielectric constants of not more than 10), etc.

Of course, the second substrate 21 is not limited to the substrates. It may be a substrate having a lower dielectric constant than that of the piezoelectric substrate 2 and producing the effect of preventing degradation of out-of-band attenuation characteristics in the present invention.

It is preferable that the thickness d2 of the second substrate 21 is larger than the thickness d1 of the piezoelectric substrate 2. Even if the piezoelectric substrate 2 itself is brittle, therefore, the second substrate 21 has strength. Therefore, the mechanical strength of the whole substrate can be prevented from being lowered.

The piezoelectric substrate 2 and the second substrate 21 can be directly joined to each other after their respective surfaces are mirror-finished by mechanical grinding and chemical grinding, and are cleaned by washing, followed by hydrophilic treatment.

Usable as the IDT electrode 3 are materials such as aluminum, an aluminum alloy, copper, a copper alloy, gold, a gold alloy, tantalum, and a tantalum alloy, or a laminated film of a plurality of layers composed of the materials, or laminated films of the materials and layers composed of materials such as titanium and chromium. Examples of a method of depositing the conductor layer are a sputtering method and an electron beam evaporation method.

Examples of a method of patterning the IDT electrode 3 include a method of depositing the IDT electrode 3, followed by photolithography, and then making RIE (Reactive Ion Etching) or wet etching.

Alternatively, a lift-off process for forming a resist on one main surface of the piezoelectric substrate before depositing the IDT electrode 3, followed by photolithography, to open a desired pattern, then depositing the conductor layer 22, and then removing the resist and the conductor layer 22 deposited in an unnecessary portion may be carried out.

The conductor layer 22 is then formed throughout the other main surface of the second substrate 21. Usable as materials for the conductor layer 22 on the other main surface of the second substrate 2 are aluminum, an aluminum alloy, and others. Examples of a method of depositing the conductor layer 22 are a sputtering method and an electron beam evaporation method.

A protective film 30 (see FIG. 6) for protecting the IDT electrode 3 is then deposited. Usable as a material for the protective film 30 are silicon, silica, etc. Examples of a method of depositing the protective film 30 are a sputtering method, a CVD (Chemical Vapor Deposition) method, and an electron beam evaporation method.

In the protective film depositing step, even in a case where the piezoelectric substrate 2 is heated to deposit the protective film in order to obtain a good film quality and adhesive properties or a case where the piezoelectric substrate 2 is not positively heated, the surface of the piezoelectric substrate 2 is exposed to plasma. Therefore, the temperature of the piezoelectric substrate becomes approximately 50 to 300° C. In such a case, however, the conductor layer 22 formed on the other main surface of the second substrate 21 effectively serves to prevent pyroelectric destruction.

A new conductor layer is then laminated on the input electrode section 5, the output electrode section 6, and the ground electrodes 8 and 11, and on the annular electrode 7 if any, to form an input pad and an output pad (indicated by black circles in FIGS. 1 to 4).

The new conductor layer is for electrically and/or structurally connecting the surface acoustic wave device 1 and the mounting substrate to each other with high reliability. For example, the conductor layer has the function of ensuring the wettability of a solder and preventing diffusion in a case where the solder is used for the connection, while having the function of adjusting gold such that it can be made to adhere using ultrasonic waves or the like in a case where a gold bump is used for the connection.

Usable as materials and structures for such a new conductor layer are a laminated film of chromium, nickel and gold or a laminated film of chromium, silver and gold, and a thick film of gold or aluminum.

Examples of a method of depositing the new conductor layer are a sputtering method and an electron beam evaporation method.

Even in a case where the piezoelectric substrate 2 is heated to deposit the conductor layer in order to also obtain a good film quality and adhesive properties in the new conductor layer depositing step or even in a case where the piezoelectric substrate is not positively heated, the surface of the piezoelectric substrate 2 is also exposed to plasma. Therefore, the temperature of the piezoelectric substrate 2 becomes approximately 50 to 300° C. In such a case, however, the conductor layer 22 on the other main surface of the second substrate 21 effectively serves to prevent pyroelectric destruction.

When the surface acoustic wave device has been manufactured by a so-called multiple sampling method in which a large number of surface acoustic wave device regions are formed on one piezoelectric substrate 2, the piezoelectric substrate 2 is then separated for each of the surface acoustic wave device regions, to obtain a large number of surface acoustic wave devices 1.

Examples of a separating method are a dicing method using a dicing blade and a laser cutting method by laser processing.

The surface acoustic wave device 1 is then mounted on the mounting substrate 31 with the one main surface opposed thereto.

The mounting substrate 31 is a circuit board, and an input terminal, an output terminal, and a ground terminal (all are not illustrated) corresponding to the input electrode section 5, the output electrode section 6, and the ground electrode 8, and a mounting substrate-side annular conductor 32 corresponding to the annular electrode 7 are formed on an upper surface of the mounting substrate 31.

According to such a surface acoustic wave apparatus, an annular electrode 7 is formed so as to enclose a filter region on the one main surface of the piezoelectric substrate 2 in the surface acoustic wave device 1, each of the pads in the surface acoustic wave device 1 is connected to each of the terminals of the mounting substrate 31 through a conductor bump, and the annular electrode 7 is connected to the mounting substrate-side annular conductor 32 formed so as to correspond to the annular electrode 7 on the upper surface of the mounting substrate 31 in such a manner that the inside of the surface acoustic wave device 1 is sealed in an annular shape using a brazing material 33 such as a solder.

This allows the airtightness on the side of an operation surface of the surface acoustic wave device 1 to be maintained, so that the surface acoustic wave device 1 can be stably operated without being affected by a sheathing protective material or the like, and the operation can be stably performed for a long time period, thereby making the surface acoustic wave apparatus highly reliable.

Degradation by oxidation or the like of each of the IDT electrodes 3, the pads, and the terminals can be effectively prevented by sealing nitrogen gas serving as inert gas, for example, into the surface acoustic wave device 1 hermetically sealed in an annular shape by the annular electrode 7 and the mounting substrate side-annular conductor 32, thereby making the surface acoustic wave apparatus more highly reliable.

As shown in FIG. 6, the surface acoustic wave device 1 mounted on the mounting substrate 31 is resin-molded using sealing resin 34. The mounting substrate 1, together with the sealing resin 34, is separated by dicing or the like for each of the surface acoustic wave devices 1, to obtain the surface acoustic wave apparatus using the surface acoustic wave device 1 according to the present invention.

The sealing resin 34 may contain a filler composed of aluminum nitride, silver, nickel, etc. The thermal conductivity of the sealing resin 34 is increased by containing such a filler, so that the heat radiation characteristics of the surface acoustic wave device 1 are improved, thereby improving the power resistance of the IDT electrode 3.

In the foregoing manner, in the surface acoustic wave device 1 according to the present invention, the filter regions each comprising the IDT electrode 3, the input electrode section 5, and the output electrode section 6 is formed, the one main surface of the second substrate 21 composed of a material having a lower dielectric constant than that of the piezoelectric substrate 2 is joined to the other main surface of the piezoelectric substrate 2, and the conductor layer 22 is formed throughout the other main surface of the second substrate 21.

This configuration allows the effective dielectric constant of the substrate itself on which the IDT electrode is formed to be made lower, as compared with that in a conventional case where a piezoelectric substrate is independently used, and a conductor layer is formed throughout the other main surface of the piezoelectric substrate.

Therefore, a parasitic capacitance formed between the input electrode section 5 and the output electrode section 6 can be reduced, and degradation of out-of-band attenuation characteristics caused by the parasitic capacitance can be restrained, so that the out-of-band attenuation characteristics can be improved.

Particularly in a surface acoustic wave apparatus of a duplexer type having a transmission-side filter region 12 and a receiving-side filter region 13, a parasitic capacitance formed between an input electrode section 5 in the transmission-side filter region 12 and an output electrode section 6 in the receiving-side filter region 13 can be reduced, and degradation of isolation characteristics caused by the parasitic capacitance can be restrained, so that the isolation characteristics can be improved.

Furthermore, the conductor layer 22 is formed throughout the other main surface of the second substrate 21, thereby making it possible to efficiently discharge charges induced by a rapid temperature change in manufacturing processes and to obtain the effect of preventing electrode damage such as pyroelectric destruction caused by the pyroelectric properties of the piezoelectric substrate.

According to the present embodiment, therefore, there can be provided a surface acoustic wave device 1 having both the effect of satisfactorily preventing pyroelectric destruction and the effect of reducing the effective dielectric constant of a substrate to prevent degradation of out-of-band attenuation characteristics and isolation characteristics and a surface acoustic wave apparatus using the same.

Figure 7:
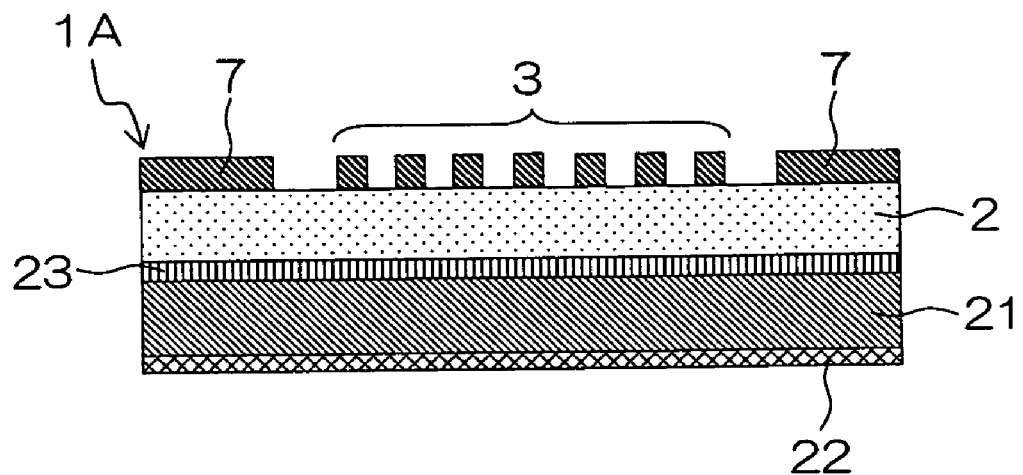
FIG. 7 is a cross-sectional view of another surface acoustic wave device according to the present invention.

FIG. 7 is a cross-sectional view of another surface acoustic wave device according to the present invention.

In a surface acoustic wave device 1A, an IDT electrode 3 is formed on one main surface of a piezoelectric substrate 2, one main surface of a second substrate 21 composed of a material having a lower dielectric constant than that of the piezoelectric substrate 2 is joined to the other main surface of the piezoelectric substrate 2, and a conductor layer 22 is formed throughout the other main surface of the second substrate 21.

Usable as a material composing the adhesive layer 23 are a vitreous member composed of borosilicate glass, quartz glass, glass ceramics, or the like, an organic material, and adhesives containing the organic material.

In order to keep a state where the piezoelectric substrate 2 and the second substrate 21 are joined to each other good by the adhesive layer 23, they may be subjected to heat treatment after adhering to each other.

Consequently, the second substrate 21 is joined to the piezoelectric substrate 2 through the adhesive layer 23 so that stress is relaxed by the adhesive layer 23. Therefore, there can be provided a surface acoustic wave device 1A capable of keeping the state where the second substrate 21 and the piezoelectric substrate 2 are joined to each other good and having good isolation characteristics and a surface acoustic wave apparatus using the same.

Figure 8:
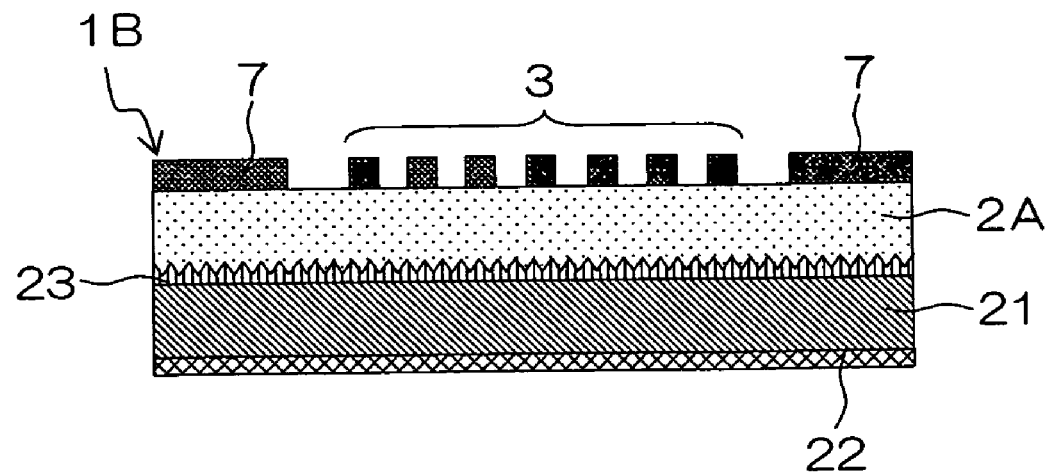
FIG. 8 is a cross-sectional view of still another surface acoustic wave device according to the present invention.
Figure 9A:
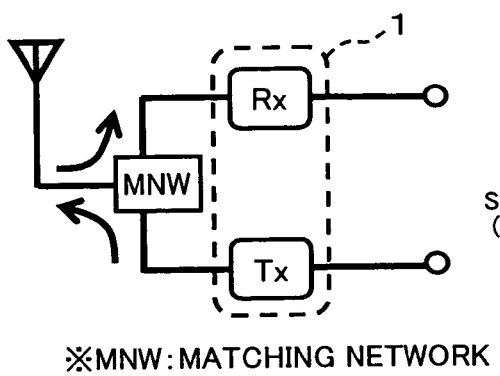
FIG. 9(a) is a circuit diagram of communications equipment in a case where there is no parasitic capacitance.
Figure 9B:
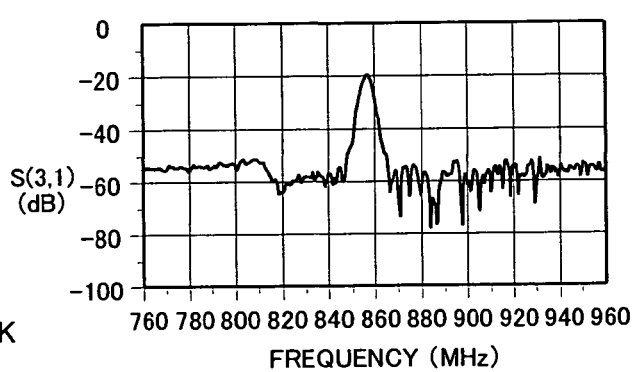
FIG. 9(b) is a graph showing an example of isolation characteristics in a case where there is no parasitic capacitance.
Figure 9C:
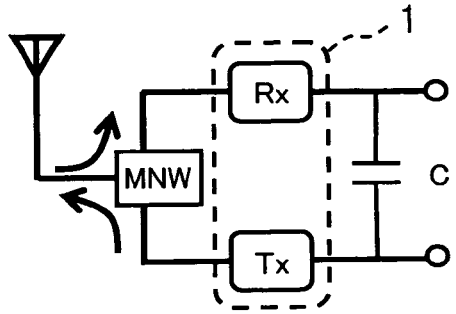
FIG. 9(c) is a circuit diagram of communications equipment in a case where there is a parasitic capacitance C.
Figure 9D:
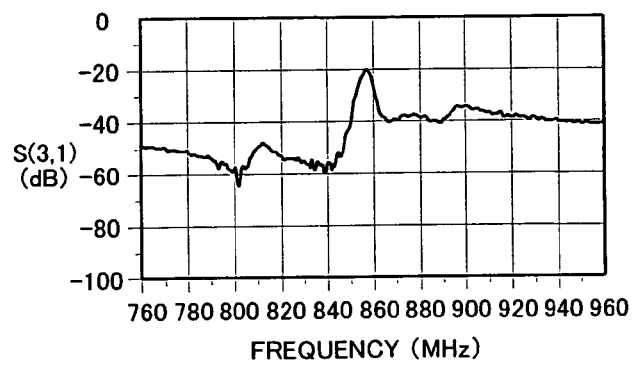
FIG. 9(d) is a graph showing an example of isolation characteristics in a case where there is a parasitic capacitance C.

FIG. 8 is a cross-sectional view of still another surface acoustic wave device according to the present invention.

In a surface acoustic wave device 1B, an IDT electrode 3 is formed on one main surface of a piezoelectric substrate 2A, one main surface of a second substrate 21 composed of a material having a lower dielectric constant than that of the piezoelectric substrate 2A is joined to the other main surface of the piezoelectric substrate 2A via the adhesive layer 23 similarly to FIG. 7, and a conductor layer 22 is formed throughout the other main surface of the second substrate 21.

The other main surface of the piezoelectric substrate 2A is made rougher than the one main surface thereof.

In order to make the other main surface of the piezoelectric substrate 2A rougher than the one main surface thereof, desired roughening can be realized by grinding the other main surface using abrasive grains, for example.

The other main surface of the piezoelectric substrate 2A is thus made rougher than the one main surface thereof so that a bulk wave is scattered on the roughened other main surface of the piezoelectric substrate. Therefore, a bulk wave generated from the IDT electrode 3 in one filter region can be prevented from being sufficiently coupled to the IDT electrode 3 formed in the other filter region. Consequently, the excited surface acoustic wave can more reliably restrain the propagation of the bulk wave whose mode has been converted, so that an amount of degradation by the propagation of the bulk wave out of degradation factors of isolation characteristics can be effectively reduced, which is advantageous in further improving the isolation characteristics.

The surface acoustic wave apparatus according to the present invention can be applied to communications equipment.

That is, in communications equipment comprising at least one of a receiving circuit and a transmission circuit, the surface acoustic wave apparatus according to the present invention can be used as a band-pass filter included in the circuit.

For example, the present invention can be applied to communications equipment comprising a transmission circuit for amplifying a transmission signal using a power amplifier, attenuating an unnecessary signal using a band-pass filter, carrying the signal on a carrier frequency using a mixer, and then transmitting the signal from an antenna through a duplexer.

The present invention is also applicable to communications equipment comprising a receiving circuit for receiving a receiving signal using an antenna, extracting the receiving signal through a duplexer, amplifying the signal using a low-noise amplifier, attenuating an unnecessary signal using a band-pass filter, and then separating the receiving signal from a carrier frequency using a mixer.

If the surface acoustic wave apparatus according to the present invention is employed for at least one of the receiving circuit and the transmission circuit, there can be provided superior communications equipment having improved transmission characteristics according to the present invention.

A duplexer composed of the surface acoustic wave apparatus according to the present invention can be applied to a front-end SAW-DPX in communications equipment, as shown in a circuit diagram of FIG. 9(*a*).

Figure 10:
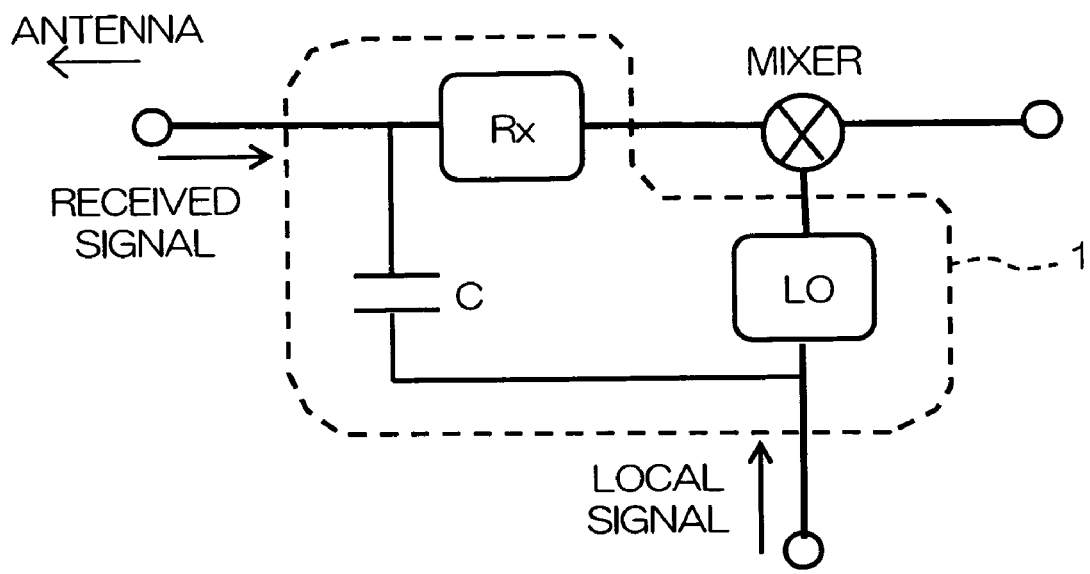
FIG. 10 is a circuit diagram showing an example in which a surface acoustic wave apparatus 1 according to the present invention is applied to a branching filter that is an integration of an Rx filter between stages and a filter having the property of passing a frequency band of a local signal.

As shown in a circuit diagram of FIG. 10, the surface acoustic wave apparatus can be also applied to a branching filter that is an integration of a receiving-side filter for preventing a local signal to a mixer from leaking out toward an antenna in converting a received signal into an intermediate frequency as well as transmitting only the received signal and a filter having the property of passing a frequency band of the local signal.

FIG. 10 is a circuit diagram showing the configuration of a mixer peripheral section in the communications equipment. In FIG. 10, a parasitic capacitance C generated by a conductor layer on the other surface of the piezoelectric substrate is together illustrated.

The present invention is not limited to the foregoing examples of conductor unformed regions. Various modifications can be made without departing from the scope of the present invention.

For example, two or more sets of branching filters may be provided on the same piezoelectric substrate. Further, another filter that does not affect the isolation characteristics of the branching filters may be provided on the same piezoelectric substrate. In this case, the area occupied by the whole of the surface acoustic wave device can be made smaller, as compared with that in a case where a plurality of surface acoustic wave devices are separately produced.

Although a case where a ladder-type filter is used is illustrated in FIGS. 1 to 4, the present invention does not limit the configuration of the filter. For example, a DMS (Dual Mode) type filter and an IIDT (Interdigitated IDT) type filter may be used.

The arrangement of input-output terminals is not limited to those shown in FIGS. 1 to 4. For example, input-output terminals may be positioned at diagonal corners of the piezoelectric substrate. In this case, a distance between the terminals is provided so that degradation of the isolation characteristics between the filters by coupling of electromagnetic waves can be reduced.

Furthermore, although a conductor layer is formed throughout the other surface of the second substrate in the foregoing example, it may be partially formed. Even if the conductor layer is partially formed, it can effectively serve to prevent pyroelectric destruction. In this case, the conductor layer in a desired region may be removed after forming the conductor layer throughout the other surface of the second substrate. Alternatively, a region having no conductor layer formed therein may be previously set to form a conductor layer in a region other than the region.

Although description was made by taking the low frequency-side filter as the transmission-side filter and taking the high frequency-side filter as the receiving-side filter, the low frequency-side filter may be defined as a receiving-side filter and the high frequency-side filter may be defined as a transmission-side filter.

It is also effective to introduce the step of joining the second substrate on the other main surface of the piezoelectric substrate in directly flip-chip mounting, on a PCB (Printed Circuit Board) in portable communications equipment or the like, a device manufactured using a so-called wafer-level-packaging (hereinafter referred to as WLP) technique for ensuring a vibration space on a surface of a piezoelectric substrate to form a sealed structure.

Figure 11:
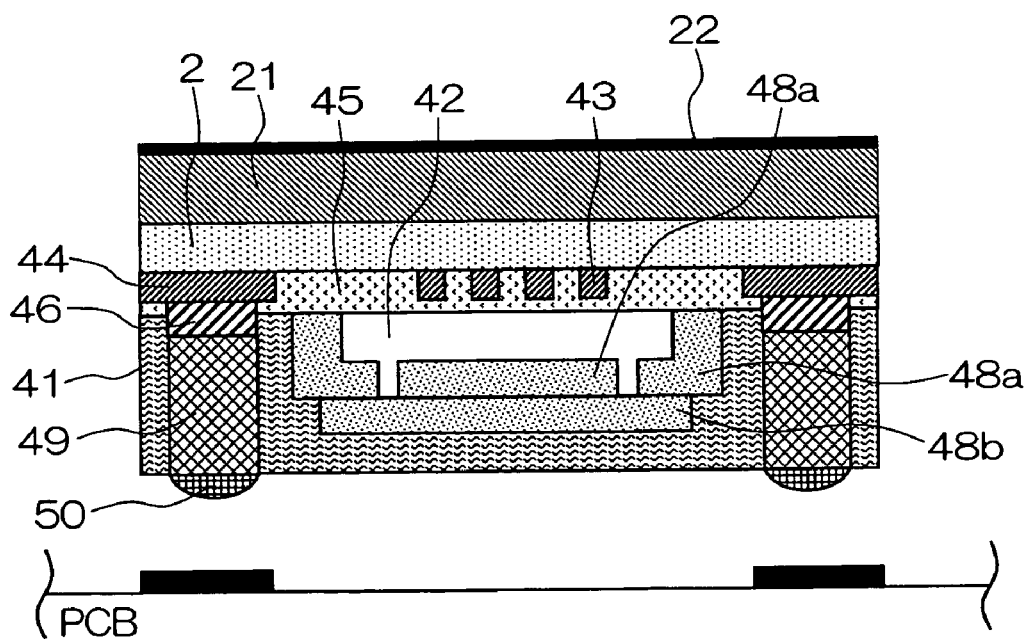
FIG. 11 is a cross-sectional view showing an example of a surface acoustic wave device manufactured using a WLP (Wafer-Level-Packaging) technique.

An example of a surface acoustic wave device manufactured using the WLP technique is illustrated in FIG. 11. An IDT electrode 43, an input-output electrode 44, and so forth are formed on a main surface of a piezoelectric substrate 2, and a vibration space 42 is ensured by cavity structures 48a and 48b. A pad electrode 46 is formed on the input-output electrode 44, and serves as a plating seed layer. Reference numeral 49 denotes a post electrode produced by plating. A terminal electrode 50, a protective film 45, sheathing resin 41, etc. may be formed as required. In the case of such a surface acoustic wave device, a very small surface acoustic wave apparatus can be realized.

Furthermore, the size of each of the electrodes and the distance between the electrodes, for example, or the number of electrode fingers and spacing between the electrode fingers are schematically illustrated for description and hence, the present invention is not limited to the same.

EXAMPLE

An example in which a surface acoustic wave filter that is the surface acoustic wave apparatus shown in FIG. 6 is specifically produced by way of trial using the surface acoustic wave device 1A shown in FIG. 7.

The other main surface of a piezoelectric substrate 2 and one main surface of a second substrate 21 were joined using a vitreous member composed of quartz glass as an adhesive layer 23 or a piezoelectric substrate 2 (125 µm in thickness) of a piezoelectric member composed of a 38.7-degree Y-cut X-propagation lithium tantalate (LT) single crystal. Used as the second substrate 21 was a quartz substrate having a dielectric constant $\epsilon r$ of 4.5. The dielectric constant 4.5 was lower than the dielectric constant 42.7 of a lithium tantalate single crystal substrate.

On one main surface of the piezoelectric substrate 2, four conductor layers respectively composed of Ti, Al-1 mass percent Cu, Ti, and Al-1 mass percent Cu were deposited in this order on the side of the substrate by a sputtering method. The thicknesses of the conductor layers were respectively 6 nm, 209 nm, 6 nm, and 209 nm.

A conductor layer 22 composed of pure Al was then formed on the other surface of the second substrate 21 by a sputtering method. The thickness of the conductor layer 22 was 200 nm.

The conductor layers on the one main surface of the piezoelectric substrate 2 were then patterned by photolithography and RIE (Reactive Ion Etching), to form a plurality of surface acoustic wave device regions each having a transmission-side filter region 12 and a receiving-side filter region 13 each comprising an IDT electrode 3, an input electrode section 5, and an output electrode section 6, as shown in FIG. 2. Used as etching gas at this time was mixed gas of $BCl_3$ and $Cl_2$.

Both the line width of comb-shaped electrodes forming the IDT electrode 3 and the distance between the adjacent comb-shaped electrodes were approximately 1 µm.

New conductor layers respectively composed of Cr, Ni, and Au were then laminated on the input electrode section 5, the output electrode section 6 and the annular electrode 7, to form an input pad and an output pad. The thicknesses of the new conductor layers were respectively 6 nm, 1000 nm, and 100 nm.

A substrate obtained by affixing the piezoelectric substrate 2 and the second substrate 21 was then separated by dicing for each of the surface acoustic wave device regions, to obtain a large number of surface acoustic wave devices 1A.

The surface acoustic wave device 1A was then mounted on a mounting substrate 31 composed of an LTCC (Low Temperature Co-fired Ceramics) substrate with its one main surface opposed thereto.

Here, the LTCC substrate had a mounting substrate-side annular conductor 32 corresponding to the annular electrode 7 formed on the one main surface of the surface acoustic wave device 1A and a pad electrode connected to the input-output pads in the surface acoustic wave device 1A. A solder was previously printed as a brazing material 33 on the mounting substrate-side annular conductor 31 and the pad electrode.

In mounting the surface acoustic wave device 1A, the surface acoustic wave device 1A was arranged so as to coincide with a solder pattern and was temporarily fixed by applying ultrasonic waves, and the solder was then melted by heating, to connect the annular electrode 7 and the mounting substrate-side annular conductor 32 to each other and to connect the input-output pads and the pad electrode to each other.

Consequently, the surface acoustic wave device 1A was completely hermetically sealed by the mounting substrate-side annular conductor 32 in the LTCC substrate and the annular electrode 7 connected thereto. The mounting process of the surface acoustic wave device 1A was carried out under a nitrogen atmosphere.

The other main surface (reverse surface) of the surface acoustic wave device 1A was then protected by sealing resin 34, and the mounting substrate 31 was finally diced between the surface acoustic wave devices 1A, thereby obtaining a surface acoustic wave filter using the surface acoustic wave device 1A according to the present invention.

As a comparative example, a surface acoustic wave apparatus using a surface acoustic wave device in which an IDT electrode was formed on one main surface of a piezoelectric substrate, and a conductor layer was formed on the other main surface of the piezoelectric substrate, as in the conventional example, was manufactured.

For comparison, Table 1 shows results of simulating the dielectric constants εr and the thicknesses d (unit: mm) of substrates and a parasitic capacitance between the IDT electrode and the conductor layer on the other main surface of the piezoelectric substrate in the example and the comparative example of the present invention.

TABLE 1

|  | Substrate | Dielectric constant ε r | Thickness d (mm) | Parasitic capacitance between excited electrode and conductor layer by simulation (pF) |
|---|---|---|---|---|
| Comparative example | LiTaO$_3$ | 42.7 | 0.25 | 0.050 |
| Example | LiTaO$_3$/quartz | 42.7/4.5 | 0.125/0.125 | 0.009 |

It is found from the results shown in Table 1 that in the example of the present invention, a parasitic capacitance between the IDT electrode and the conductor layer on the other main surface can be reduced to approximately one-fifth of that in the comparative example.

Figure 12A:
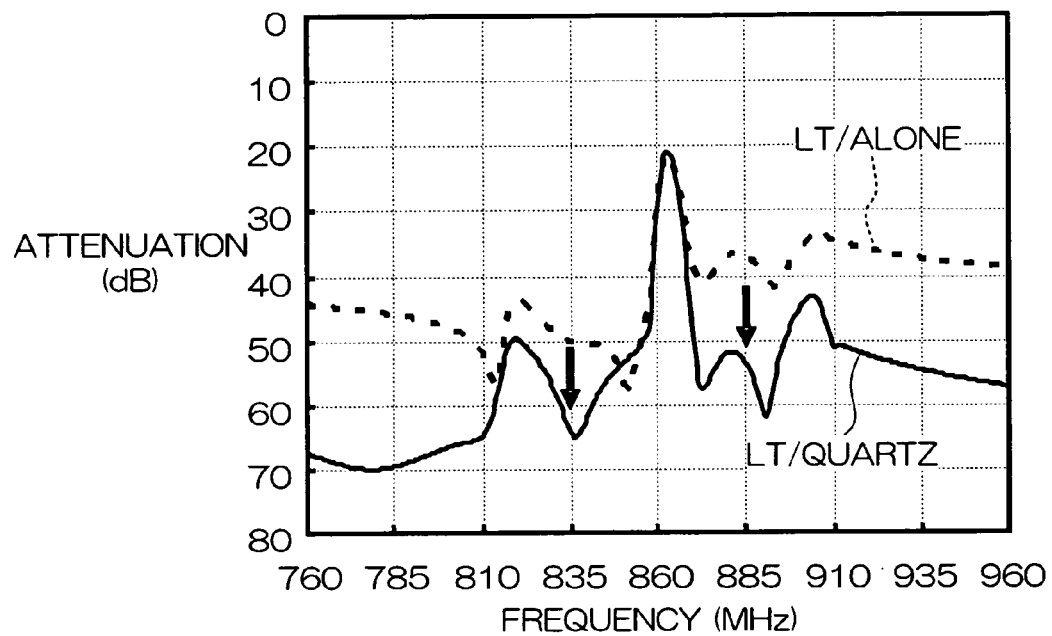
FIGS. 12(a) and 12(b) are graphs showing the pass-band characteristics of a surface acoustic wave apparatus manufactured in an example of the present invention.
Figure 12B:
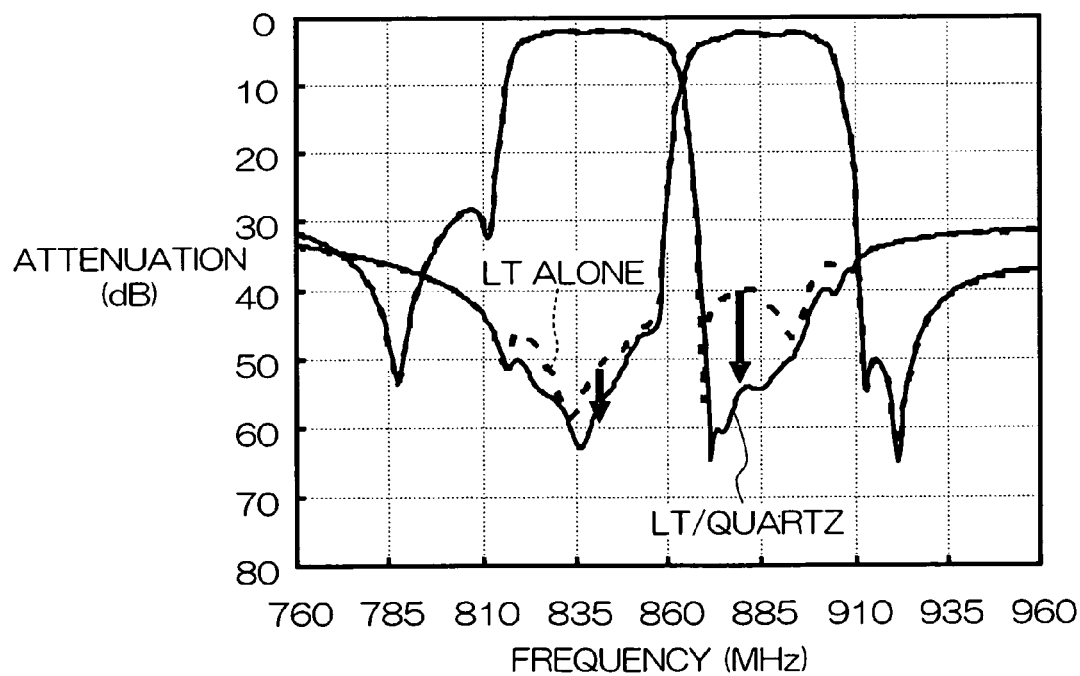
Figure 13:
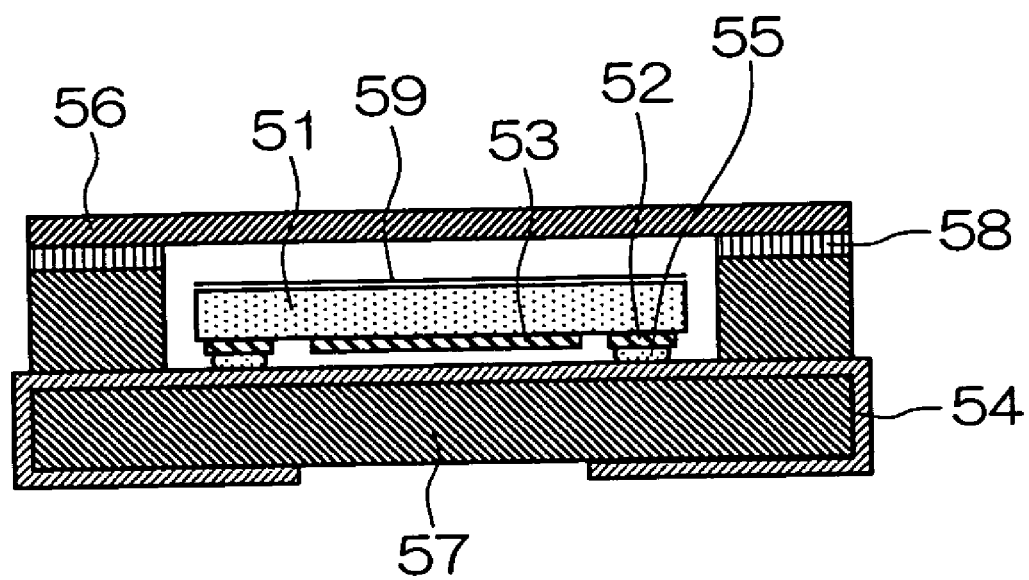
FIG. 13 is a cross-sectional view schematically showing a mounting structure of a conventional surface acoustic wave apparatus.

FIGS. 12(a) and 12(b) are respectively graphs showing isolation characteristics and frequency characteristics that were measured with respect to the surface acoustic wave apparatus in the example of the present invention thus manufactured.

In the respective graphs, a frequency (unit: MHz) is used to enter the horizontal axis, and an attenuation (unit: dB) is used to enter the vertical axis. A characteristic curve indicated by a broken line shows results in the comparative example in which the LT substrate was independently used, and a characteristic curve indicated by a solid line shows results in the example in which the first substrate composed of LT and the second substrate composed of quartz were used. The isolation characteristics were found by applying an RF signal to an input terminal of a Tx filter and measuring a signal from an output terminal of an Rx filter in the configuration (in a case where there is a parasitic capacitance C) shown in a circuit diagram of FIG. 9(c) (measured in a state where a matching network generally inserted between the Tx filter and the Rx filter when the surface acoustic wave apparatus was employed as a branching filter was incorporated, as shown in the same circuit diagram).

The surface acoustic wave apparatus in the example of the present invention had much better isolation characteristics, as compared with those in the comparative example, as apparent from the results shown in FIG. 12(a).

As a result, the out-of-band attenuation in the vicinity of the pass band was improved, as compared with that in the comparative example, as apparent from the results shown in FIG. 12(b).

Although the present invention has been described and illustrated in detail, it is clearly understood that the same is by way of illustration and example only and is not to be taken by way of limitation, the spirit and scope of the present invention being limited only by the terms of the appended claims.

This patent application corresponds to Japanese Patent Application 2004-220060, which was filed with the Japan Patent Office on Jul. 28, 2004. The whole disclosure of Japanese Patent Application 2004-220060 is incorporated herein by reference.

The invention claimed is:

1. A surface acoustic wave device in which an IDT electrode, an input electrode section, and an output electrode section are formed in a filter region on one main surface of a first substrate composed of a piezoelectric member, wherein
   a second substrate composed of a material having a lower dielectric constant than that of the first substrate is joined to the other main surface of the first substrate, and
   a conductor layer is formed on a surface of the second substrate opposite to the surface joined to the first substrate, and
   wherein the conductor layer is formed throughout the surface of the second substrate opposite to the surface joined to the first substrate,
   wherein the second substrate is a multilayer substrate.

2. The surface acoustic wave device according to claim 1, wherein the filter region comprises a transmission-side filter region and a receiving-side filter region, and
   the IDT electrode, the input electrode section, and the output electrode section are formed in each of the filter regions.

3. The surface acoustic wave device according to claim 1, wherein the second substrate is joined to the first substrate through an adhesive layer.

4. The surface acoustic wave device according to claim 1, if wherein the other main surface of the first substrate is a surface rougher than the one main surface of the first substrate.

5. The surface acoustic wave device according to claim 1, wherein the second substrate is composed of a material having a lower coefficient of thermal expansion than that of the first substrate composed of a piezoelectric member.

6. The surface acoustic wave device according to claim 1, wherein the second substrate is composed of a material selected from silicon, glass, sapphire, quartz, crystal, resin, and ceramics.

7. The surface acoustic wave device according to claim 1, wherein the relationship between the thickness d2 of the second substrate and the thickness d1 of the first substrate is d2>d1.

8. A surface acoustic wave apparatus, comprising:
   a surface acoustic wave device having an IDT electrode, an input electrode section, and an output electrode section that are formed in a filter region on one main surface of a first substrate composed of a piezoelectric member, a second substrate composed of a material having a lower dielectric constant than that of the first substrate joined to the other main surface of the first substrate, and a conductor layer formed throughout a surface of the second substrate opposite to the surface joined to the first substrate, wherein the second substrate is a multilayer substrate, and a mounting substrate, wherein the surface acoustic wave device is mounted on the mounting substrate with the main surface, on which the filter region is formed, of the first substrate in the surface acoustic wave device opposed thereto.

9. The surface acoustic wave device according to claim 8, wherein the other main surface of the first substrate is a surface rougher than the one main surface of the first substrate.

10. Communications equipment comprising at least one of a receiving circuit and a transmission circuit having the surface acoustic wave apparatus according to claim 8.

11. Communications equipment, wherein the surface acoustic wave apparatus according to claim 8 is used as a branching filter.

* * * * *